United States Patent [19]

Johnson et al.

[11] Patent Number: 4,657,336

[45] Date of Patent: Apr. 14, 1987

[54] SOCKET RECEPTACLE INCLUDING OVERSTRESS PROTECTION MEANS FOR MOUNTING ELECTRICAL DEVICES ON PRINTED CIRCUIT BOARDS

[75] Inventors: Richard E. Johnson, Jamestown, N.Y.; Robert R. Johnson, Ludlow; Doyle E. Cribbs, Warren, both of Pa.

[73] Assignee: GTE Products Corporation, Stamford, Conn.

[21] Appl. No.: 810,158

[22] Filed: Dec. 18, 1985

[51] Int. Cl.[4] .......................... H01R 11/22; H05K 3/32

[52] U.S. Cl. .............................. 339/258 R; 339/17 C

[58] Field of Search ............. 339/17 C, 256 R, 258 R, 339/258 A, 258 P

[56] References Cited

U.S. PATENT DOCUMENTS 3,120,418 2/1964 Deakin ............................ 339/258 R
3,609,640 9/1971 Longenecker et al. ......... 339/258 P
4,540,234 9/1985 Könnemann et al. .......... 339/258 R

FOREIGN PATENT DOCUMENTS 674830 4/1939 Fed. Rep. of Germany ... 339/258 R
888246 12/1981 U.S.S.R. ............................ 339/17 C

OTHER PUBLICATIONS

IBM Technical Disclosure Bulletin, vol. 14, No. 9, Feb., 1972, B. R. Kryzaniwsky.

*Primary Examiner*—E. Michael Combs
*Attorney, Agent, or Firm*—William H. McNeill

[57] ABSTRACT

Miniature socket receptacles employing multiple, flexed legs for contacting an inserted male pin include means for preventing the legs from being overstressed by misalignment of the male pin causing a force transverse to the longitudinal axis of the receptacle. The means can be right angled flanges formed at the terminal portion of the legs or a constriction formed in the throat of the receptacle.

5 Claims, 10 Drawing Figures

SOCKET RECEPTACLE INCLUDING OVERSTRESS PROTECTION MEANS FOR MOUNTING ELECTRICAL DEVICES ON PRINTED CIRCUIT BOARDS

TECHNICAL FIELD

This invention relates to sockets and more particularly to sockets receptacles for use with printed circuit boards. Still more particularly, the sockets include means for preventing portions of the socket from being overstressed.

BACKGROUND ART

Most modern electronic equipment utilizes printed wiring boards, or, as they are more commonly called, printed circuit boards. These boards are formed from electrically insulating material and have the desired circuitry in the form of electrically conductive paths printed thereon. There are basically two commonly employed techniques for mounting electrical components upon these boards. One technique involves inserting the electrical contacts of a device through apertures in the board and soldering the contacts in place. This procedure is simple and cost effective but has the disadvantage of the difficulty of replacing defective components. The second technique involves the intermediary of a socket, which is a device formed of an electrically insulating material which carries a plurality of receptacles for receiving the contacts of a component. The terminal pins of the socket are soldered in place on the printed circuit board. This system has the advantage that the component is easily replaced by unplugging a defective unit and plugging in a new one. The disadvantages lie in the facts that it is expensive to make the socket in the first place and that if the contact configuration of the component be changed, then a new (and expensive) socket is required.

Most of these objectionable features have been obviated by the provisions of socket receptacles which are inserted into plated-through holes in the printed circuit boards. The holes are provided in a desired pattern in the board to receive a component directly, thus eliminating the need for a separate and distinct socket.

Such an approach is described in U.S. Pat. application Ser. No. 659,152, filed Oct. 9, 1984 and assigned to the assignee of the instant invention. The miniature socket receptacles described therein are constructed from material only 0.0055" thick and have an overall length of approximatly 0.080". Generally, these receptacles have a flexible, hollow body with a circumferential extent of greater than 180° but less than 360°. The body has a proximal portion with a given external diameter and a distal portion having an internal diameter less than the given diameter. The distal portion is formed to provide at least three legs. These legs are highly stressed so that adequate electrical contact can be made to the male pin inserted therein. While these receptacles function adequately when all goes well, problems are occassionally encountered. For example, when a male pin of maximum size is inserted into the receptacle, the legs are necessarily stressed to near the elastic limit of the receptacle material. If, at this point, a force is accidentally applied in a direction transverse to the direction of pin insertion (i.e., along the longitudinal axis of the receptacle) then one or more of the legs may be damaged. Unfortunately, such forces are quite often generated during the insertion or withdrawal of electronic devices which use an array of many such receptacles.

DISCLOSURE OF INVENTION

It is, therefor, an object of the invention to obviate the disadvantages of the prior art.

It is another object of the invention to enhance the connecting of electrical components.

It is a further object of the invention to provide a socket receptacle which includes means for preventing overstressing.

These objects are accomplished, in one aspect of the invention, by the provision of an elongated, electrical contact receiving, socket receptacle which comprises a flexible, hollow body having a longitudinal axis. The body has proximal and distal portion with the latter being provided with a plurality of legs each of which is formed to provide a desired amount of stress. The socket receptacle includes means to prevent the legs from being overstressed.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
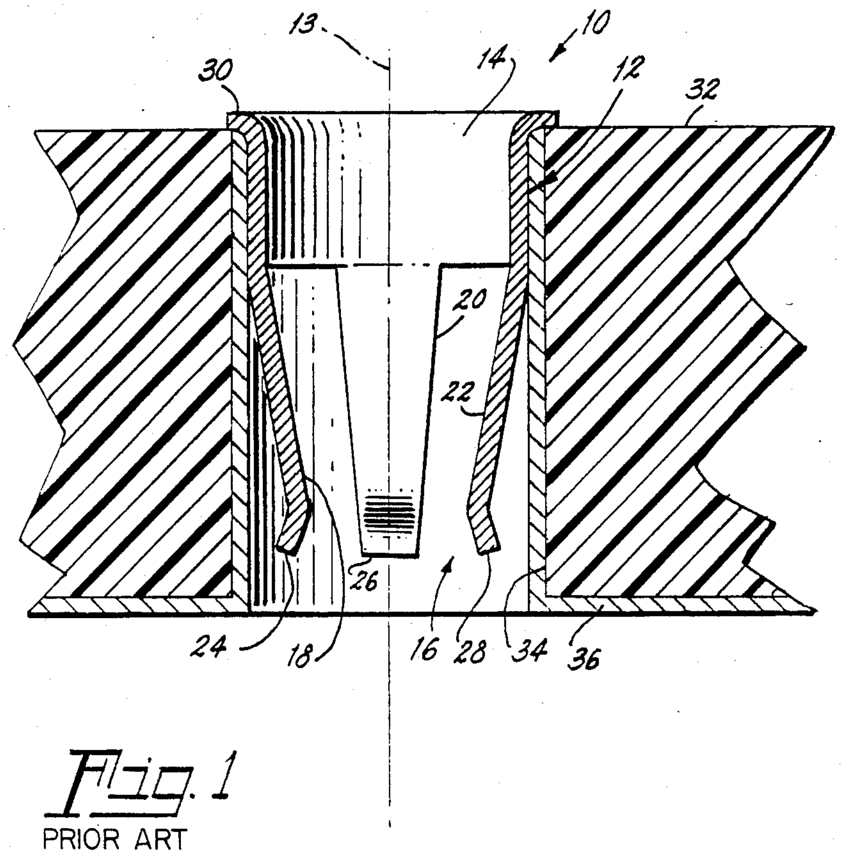
Fig. 1 PRIOR ART
FIG. 1 is an elevational, sectional view of a socket receptacle.

Referring now to the drawings with greater particularity, there is shown in FIG. 1 a prior electrical contact receiving socket receptacle 10. The socket receptacle 10 has a relatively thin, hollow body 12 which may have a circumferential extent of greater than 180° but less than 360° with about 270° being preferred (see FIG. 3), and a longitudinal axis 13.

Body 12 has a proximal portion 14, which is preferably imperforate and which has a given external diameter, and a distal portion 16 which has an internal diameter less than the given external diameter. The distal portion 16 is formed to provide a plurality of legs; e.g., three legs 18, 20, and 22. The terminal ends 24, 26, and 28 of legs 18, 20, and 22 are formed to project away from the internal diameter at a slight angle (i.e., away from the longitudinal axis 13 of the body 12); however, the diameter traced by the terminal ends is less than the given external diameter.

The proximal portion 14 is provided with a circumferential flange 30 which projects from proximal portion 14 at a substantially right angle. The flange 30 seats against a surface of a printed circuit board 32 when the socket receptacle is inserted therein.

In a preferred form, socket receptacles 10 can be stamped (or chemically etched) from a phosphorus-bronze or berillium-copper material which can be under-plated with nickel and over-plated with gold, depending upon the end use.

While size is not a critical element of the inventive concepts herein disclosed, socket receptacles 10 are ideally suited to miniaturization. In a preferred form, socket receptacle 10 can be made from material having a thickness of about 0.005" (0.125 mm) and a major diameter over flange 30 of about 0.060" (1.5 mm). The proximal portion 14 can have an external diameter of about 0.050" (1.25 mm) and the overall length of socket receptacle 10 can be about 0.081" (2.025 mm). With socket receptacles of such small size it is preferred that the entire receptacle be contained within the thickness of the printed circuit board 32 with which it is to be utilized; therefore, the socket receptacle described above could be employed with a printed circuit board having a thickness of about 0.085" (2.125 mm).

The circuit board 32 contains apertures 34 for receiving the receptacles 10. At least one surface of board 32 contains electrical conductor 36, which conductor is continuous within aperture 34. Board 32 can also be of the multi-layer variety.

Figure 2:
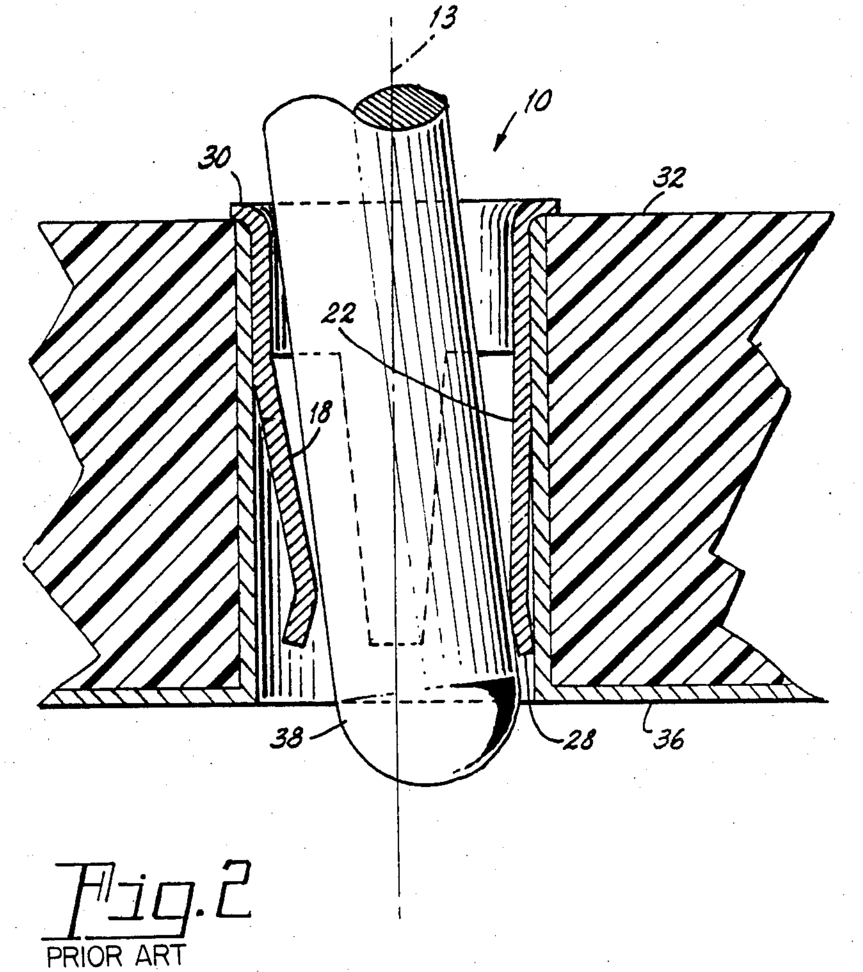
Fig. 2 PRIOR ART
FIG. 2 is an elevational, sectional view illustrating damage to a socket receptacle caused by misalignment of an inserted contact pin.

Referring now to FIG. 2, the illustration depicts a male pin 38 which is mis-aligned with respect to axis 13, thus applying an undesired force in a direction transverse to the axis 13. This transverse force can be sufficient to overstress one or more of the legs of the receptacle (leg 22 in FIG. 2) thus rendering the receptacle unfit for further use.

Figure 3:
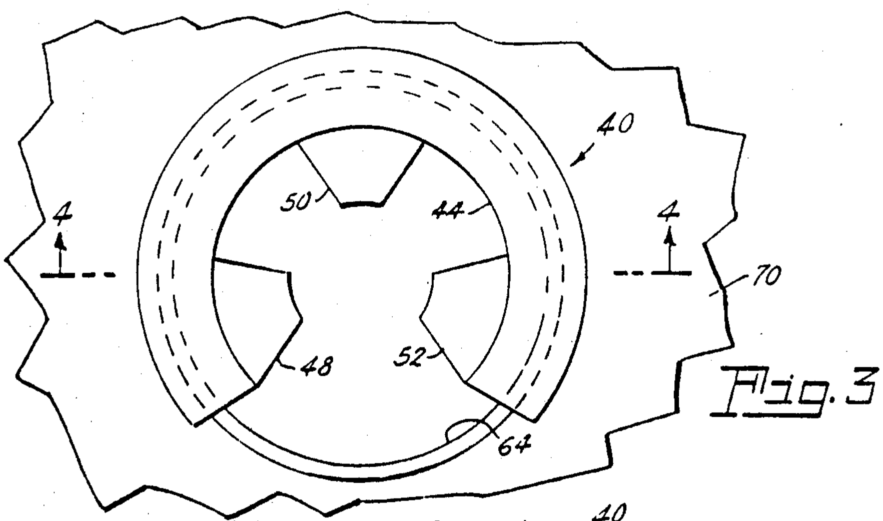
FIG. 3 is a plan view of a socket receptacle.
Figure 4:
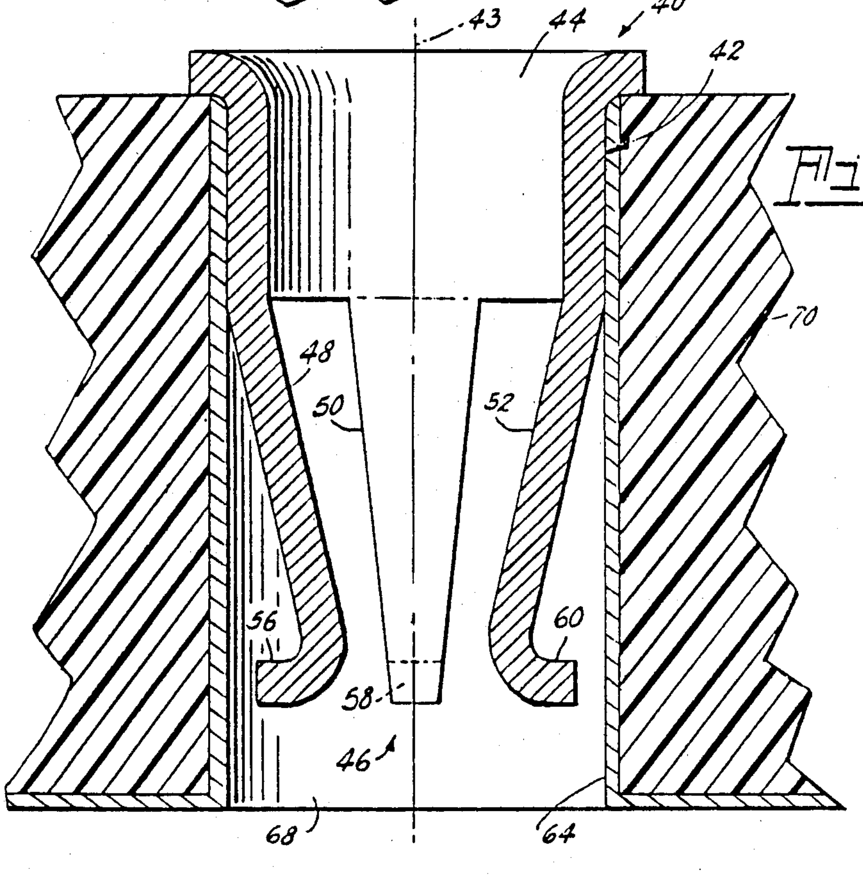
FIG. 4 is an elevational, sectional view taken along the line 4—4 of FIG. 3 and illustrating an embodiment of the invention.

A socket receptacle 40 in accordance with an aspect of the invention is shown in FIGS. 3 and 4 on an enlarged scale.

Receptacle 40 has a thin, hollow body 42 and a longitudinal axis 43 (FIG. 4). The body may have a circumferential extent of greater than 180° but less than 360°.

Body 42 has a proximal portion 44 which has a given external diameter and a distal portion 46 which has an internal diameter less than the given external diameter. The distal portion 46 is formed to provide a plurality of legs; e.g., three legs 48, 50 and 52.

Receptacle 40 further includes overstress prevention means 54. In the embodiment shown in FIGS. 4, 5 and 6 the overstress prevention means 54 comprises flanges 56, 58 and 60 formed, respectively, on the terminal ends of legs 48, 50 and 52. The flanges extend in a direction substantially normal to axis 43 and away therefrom.

Figure 5:
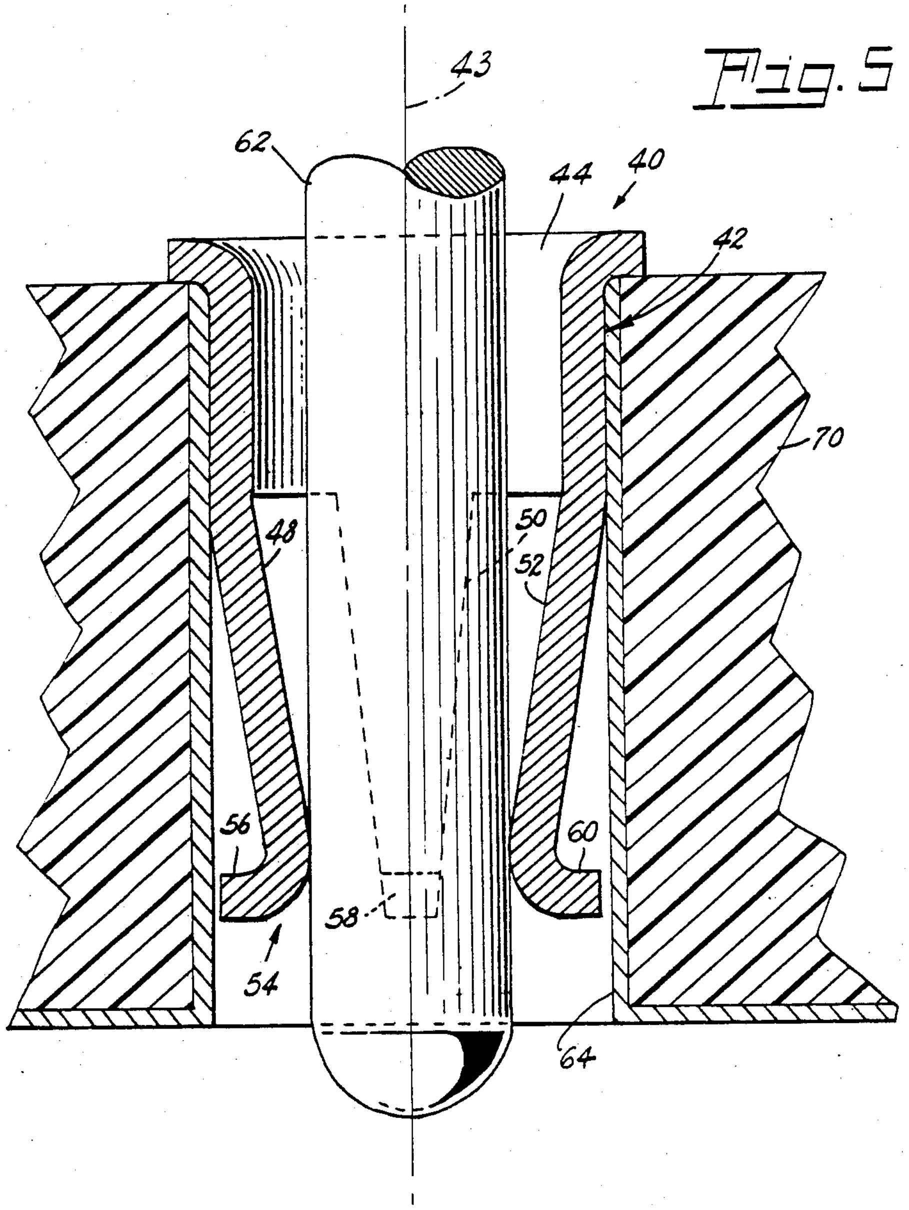
FIG. 5 is a view similar to FIG. 4 illustrating proper alignment of a contact pin.
Figure 6:
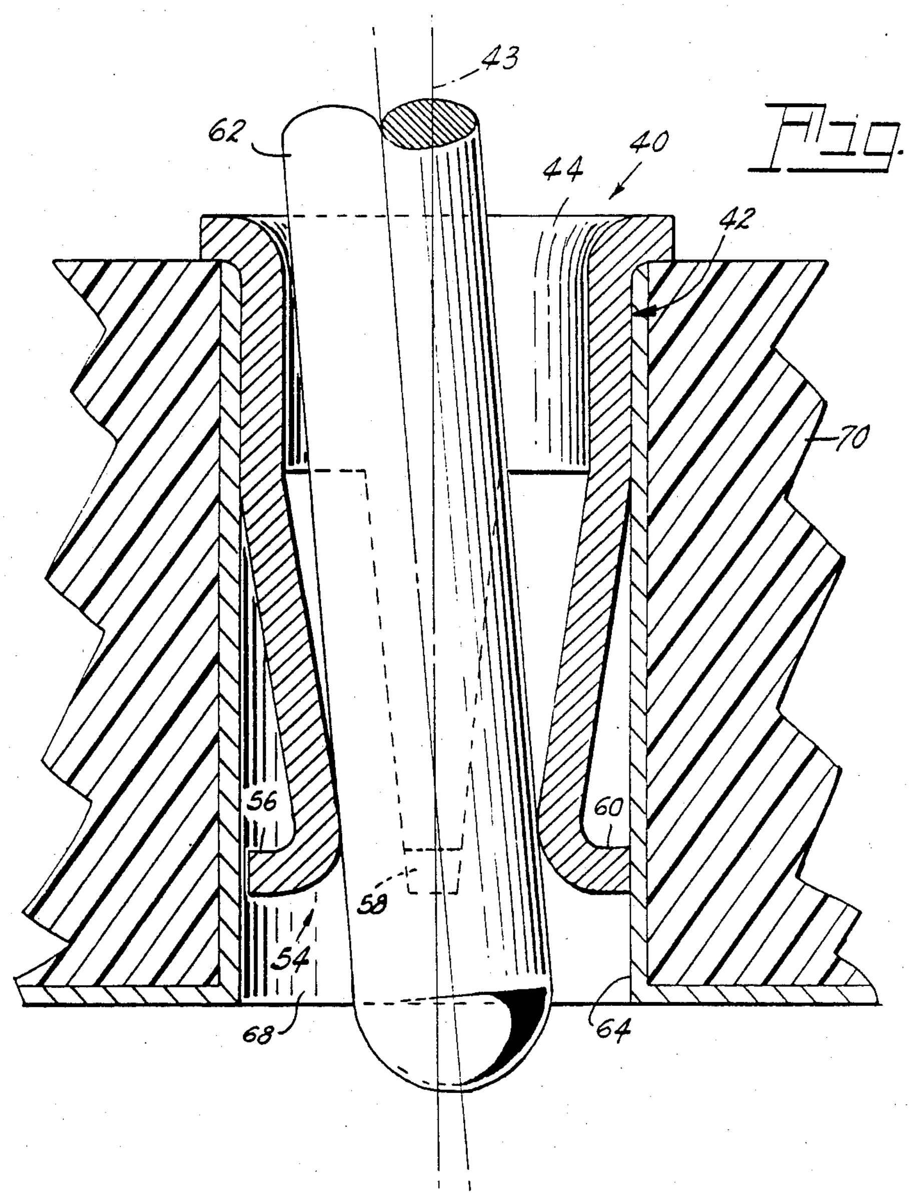
FIG. 6 is a view similar to FIG. 5 illustrating the operation of an embodiment of the invention.

As shown in FIG. 5, when a male pin 62 is properly inserted or withdrawn, no undesired transverse forces are applied and the flanges 56, 58 and 60 do not come into play. If, however, the male pin 62 is mis-aligned, or angled so as to apply an undesired transverse force (see FIG. 6) the overstress prevention means 54 in the form of the flange 60 (in the particular example) will contact the inside wall 64 of aperture 68 in circuit board 70 before the overstress point of the leg (or legs) is reached, thus saving the receptacle 40 for reuse by maintaining the desired contact stress built into the legs.

Figure 7:
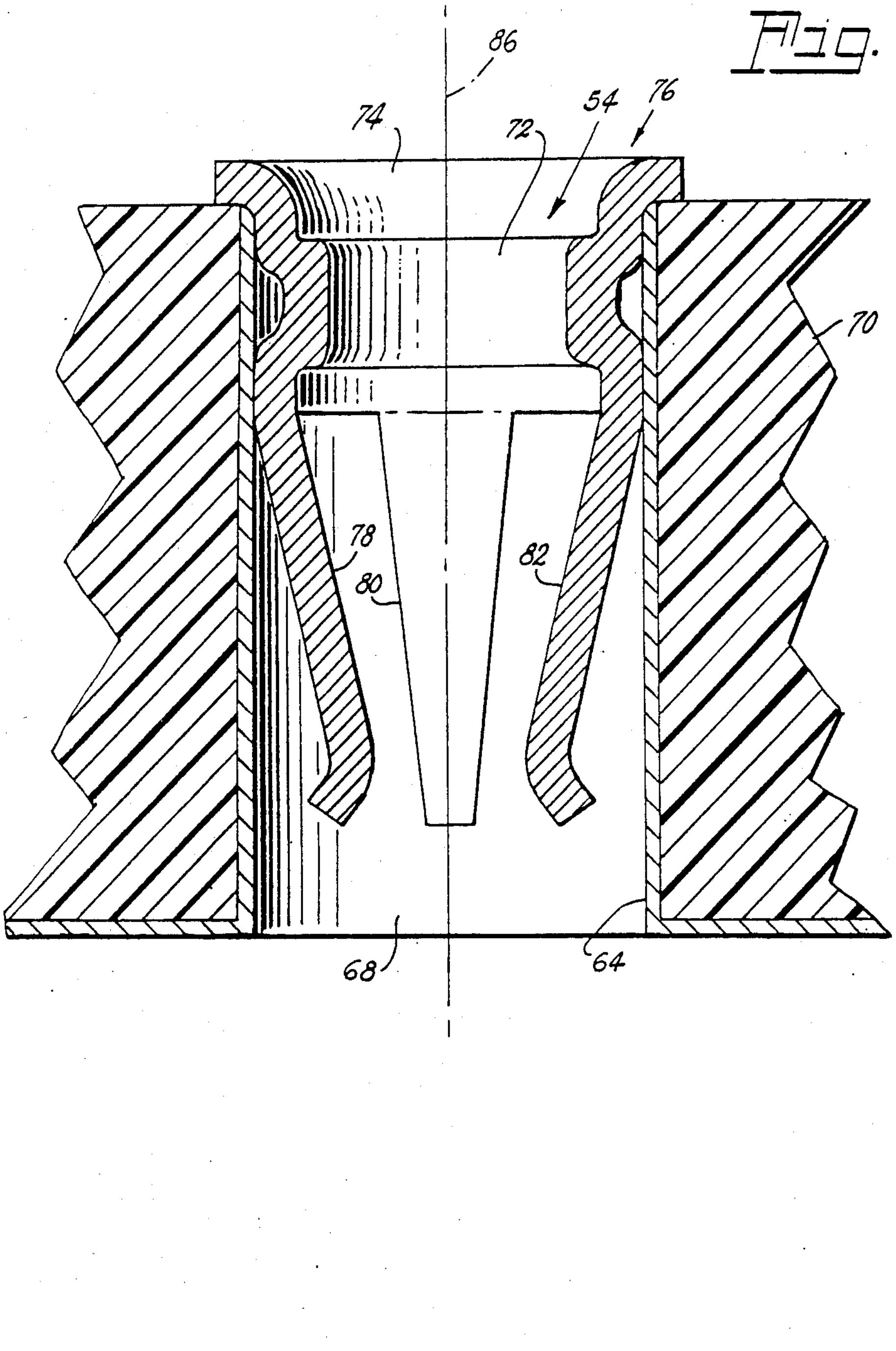
FIG. 7 is a view similar to FIG. 4 illustrating an alternate embodiment of the invention.
Figure 8:
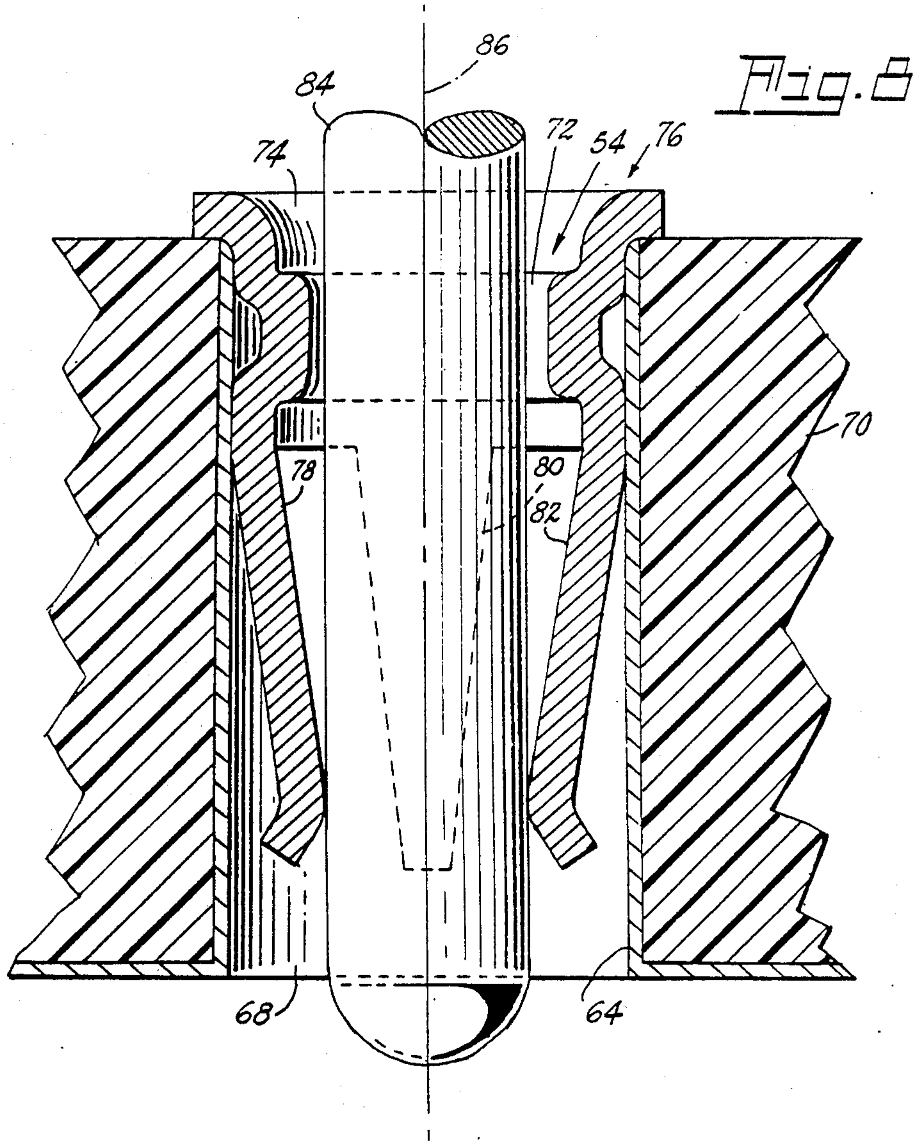
FIGS. 8 and 9 are views similar to FIGS. 5 and 6.
Figure 9:
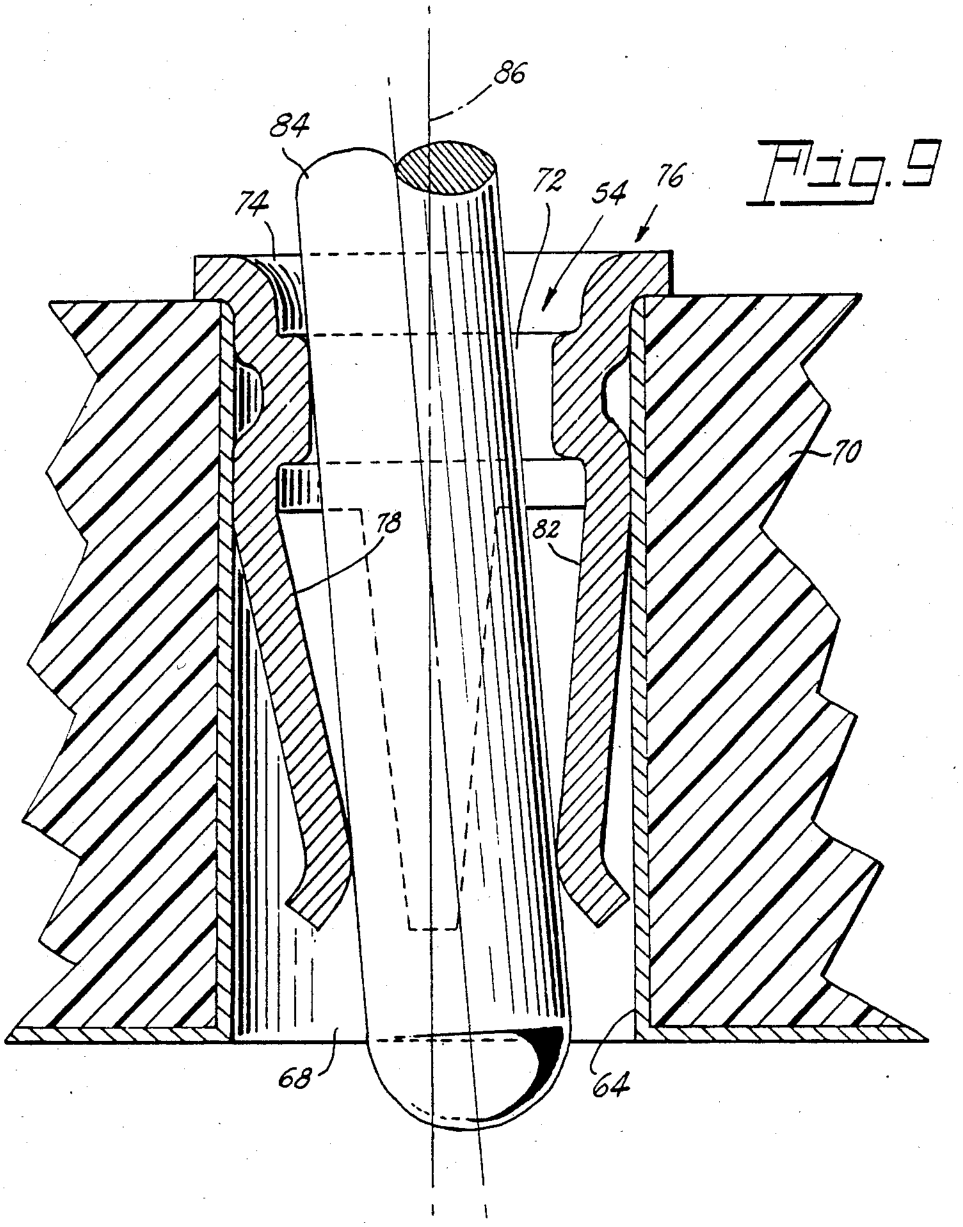

An alternate form of the invention is shown in FIGS. 7, 8 and 9 wherein the overstress prevention means 54 is formed as an inwardly projecting protuberance 72 in the throat or proximal portion 74 of a socket receptacle 76. In this instance, it is not necessary to alter the configuration of the legs 78, 80 and 82.

When a male pin 84 is properly inserted into receptacle 76, i.e., substantially in alignment with receptacle axis 86, (see FIG. 8) no undesired transverse force is applied to the legs and the overstress prevention means 54 does not come into play.

In the event of an undesired transverse force being applied, e.g., by misalignment of male pin 84 (see FIG. 9) the pin 84 will contact the overstress prevention means 54 and overstressing of the legs will be avoided.

Figure 10:
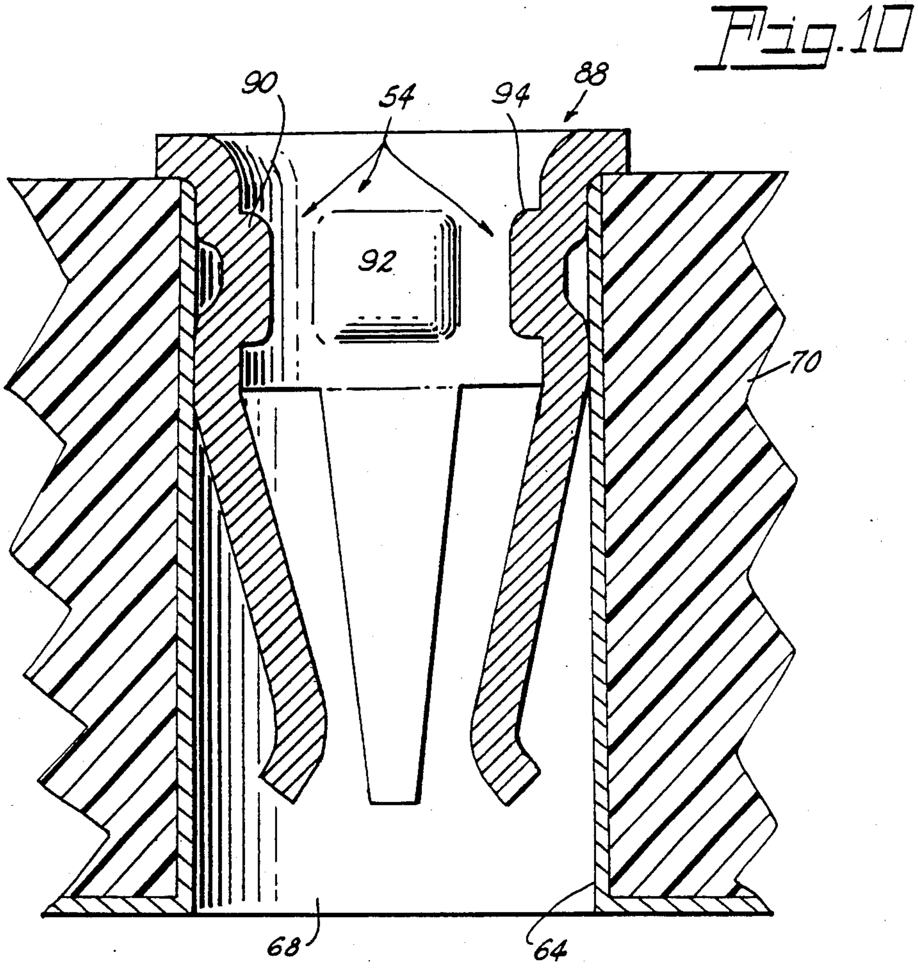
FIG. 10 is a view similar to FIG. 4 illustrating another embodiment of the invention.

Yet another embodiment is shown in FIG. 10 wherein the overstress prevention means 54 is formed in a receptacle 88 a a plurality of discrete, inwardly extending protuberances 90,92, 94 equal in number to and aligned with, the legs. The discrete protuberances function similarly to the continuous protuberance 72 of the embodiment shown in FIGS. 7, 8 and 9.

Thus, there is provided a socket receptacle which is eminently reuseable since it incorporates means of preventing the contact portions thereof, e.g., the legs, from becoming overstresed and thus rendered unfit for future use. Electrical components employing male pins can more easily be inserted into and withdrawn from such receptacles since the alignment factor is less critical than before, thus obviating the disadvantages of the prior art and enhancing component connection.

While there have been shown what are considered to be the preferred embodiments of the invention, it will be apparent to those skilled in the art that various changes and modifications can be made herein without departing from the scope of the invention as defined by the appended claims.

We claim:

1. An elongated, electrical contact receiving, socket receptable formed for insertion and retention in a receiving aperture in a printed circuit board, said socket receptacle comprising: a relatively thin, flexible, hollow body having a longitudinal axis and having a circumferential extent of greater than 180° but less than 360°; said body having a proximal portion having a given external diameter sized to fit said receiving aperture; and a distal portion having an internal diameter less than said given external diameter, said distal portion being formed to provide at least three legs which are substantially parallel to said longitudinal axis, each of said legs being formed to provide a desired amount of stress; said socket receptacle including means to prevent said at least three legs from being overstressed by the application of a force applied thereto in a direction transverse to said longitudinal axis, said means to prevent said at least three legs from being overstressed comprising a flange formed on the terminal end of each of said at least legs, said flange extending in a direction substantially normal to said longitudinal axis and away from said longitudinal axis.

2. The socket receptable of claim 1 wherein said means to prevent said at least three legs from being overstressed comprises at least one constriction formed in said proximal portion, said constriction extending inwardly toward said longitudinal axis.

3. The socket receptacle of claim 2 wherein said constriction is laterally continuous about the interior circumference of said proximal portion.

4. The socket receptacle of claim 2 wherein said constriction is segmented and the number of segments is equal in number to said legs.

5. The socket receptacle of claim 4 wherein said segments are aligned with said legs.

* * * * *